United States Patent
Lin et al.

(10) Patent No.: US 7,545,233 B2
(45) Date of Patent: Jun. 9, 2009

(54) LAYOUT CONFIGURATION OF DIFFERENTIAL SIGNAL TRANSMISSION LINES FOR PRINTED CIRCUIT BOARD HAVING OFFSET VIAS

(75) Inventors: Yu-Hsu Lin, Fullerton, CA (US);
Shang-Tsang Yeh, Tu-cheng (TW);
Chuan-Bing Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 254 days.

(21) Appl. No.: 11/446,950

(22) Filed: Jun. 5, 2006

(65) Prior Publication Data
US 2006/0284697 A1     Dec. 21, 2006

(30) Foreign Application Priority Data
Jun. 17, 2005     (CN)     ............... 2005 1 0035392

(51) Int. Cl.
*H01P 3/04*     (2006.01)

(52) U.S. Cl. .............................................. 333/4; 333/5
(58) Field of Classification Search ................. 333/4, 333/5
See application file for complete search history.

(56) References Cited

U.S. PATENT DOCUMENTS

| 6,710,255 | B2 * | 3/2004 | Ross et al. | ................... 174/255 |
| 6,791,429 | B2 | 4/2004 | Mikalauskas | |
| 6,812,803 | B2 * | 11/2004 | Goergen | ......................... 333/1 |
| 7,151,420 | B2 * | 12/2006 | Brunker et al. | ................. 333/4 |

* cited by examiner

*Primary Examiner*—Benny Lee

(57) ABSTRACT

A layout configuration of a differential pair for a printed circuit board (PCB) having a signal plane is provided. In a preferred embodiment, the layout configuration comprises: a differential pair on the signal plane; a pair of vias abutting the differential pair, and the pair of vias being mutually dissymmetrical about the differential pair; and a distance between the pair of vias along the differential pair being equal to ½ TV, wherein T is a signal rise time, V is a speed of the signal. Therefore, the layout configuration can meet with the requirements of impedance matching, reduce reflection, and improve signal integrity.

11 Claims, 3 Drawing Sheets

LAYOUT CONFIGURATION OF DIFFERENTIAL SIGNAL TRANSMISSION LINES FOR PRINTED CIRCUIT BOARD HAVING OFFSET VIAS

BACKGROUND

1. Field of the Invention

The present invention relates to a layout configuration of signal transmission lines of a printed circuit board (PCB), and more particularly to a layout configuration of signal transmission lines of a (PCB) with regard to the signal integrity of high-speed signals.

2. General Background

With the ever increasing speeds of integrated circuits (ICs), signal integrity is becoming one of the most important problems. Many factors, such as the parameters of the electrical elements or the PCB and the layout of the PCB, can affect the signal integrity, or lead to instability of the system, possibly even causing the system to breakdown. Thus, preserving signal integrity has become a key point in the design of a PCB. Impedance matching is an important thing for maintaining signal integrity. When the characteristic impedance of a transmission line does not match the impedance of the load, part of the signal will be reflected at the receiving end of the transmission lines. Thus, the signal will be distorted. Many factors can affect impedance matching, such as configuration, characteristic, topology, and output impedance of the signal source-end of the transmission lines, and characteristics of the load and so on. Now in the design of the high-speed signal circuit, differential signals are widely used to improve signal quality. Differential pairs have the following advantages:

a). A strong capability of resisting interference;

b). Capable of restraining electromagnetic interference (EMI);

c). Precise timing position.

How to best utilize these advantages while maintain signal integrity, is a big challenge to an engineer. However, in practice, the impedance of the signal transmission lines does not match that of vias.

Referring to FIGS. 1 and 2, a PCB 90 includes a first signal plane 3, a ground plane 5, a power plane 8, a second signal plane 31, and three medium layers 4 as shown in FIG. 2. Between two of the planes, which mutually abut, there is one of the three layers 4. In the first signal plane 3, there is a differential pair 33. The differential pair 33 includes a line 1 and a line 2. The line 1 and the line 2 have a same length, and are parallel. A width of the line 1 or the line 2 is W1 as shown in FIG. 2. The space between the line 1 and the line 2 is M1 as shown in FIG. 2. Discontinuous connective points like a via 6 abutting the line 1 and a via 7 abutting the line 2 are symmetrical about the differential pair 33 as shown in FIG. 1. Radiuses of the vias 6 and 7 are same. Generally, impedance of vias is lower than impedance of a transmission line. Thus when a driver of the signal source-end sends a pair of differential signals, values of which are equivalent but polarities of which are opposite to the differential pair 33, the differential signals will be reflected. Through analysis, we find that there is a great deal of reflection in the differential pair 33. The reflection reduces the signal integrity.

What is needed is a differential pair, which can meet with the requirement of impedance matching, reduce reflection, and improve signal integrity.

SUMMARY OF THE INVENTION

A layout configuration of a differential pair for a printed circuit board (PCB) having a signal plane is provided. In a preferred embodiment, the layout configuration comprises: a differential pair on the signal plane; a pair of vias abutting the differential pair, and the pair of vias being mutually dissymmetrical about the differential pair; and a distance between the pair of vias along the differential pair being equal to ½ TV, wherein T is a signal rise time, V is a speed of the signal.

Other advantages and novel features will become more apparent from the following detailed description when taken in conjunction with the accompanying drawings, in which:

DETAILED DESCRIPTION OF THE PREFFERED EMBODIMENTS

Figure 1:
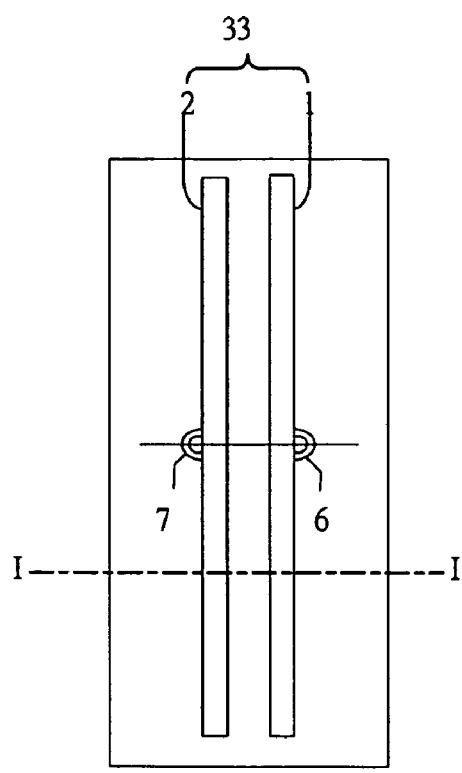
FIG. 1 is top view of a typical related art 4-layer PCB with a differential pair having two mutually symmetrical vias.
Figure 2:
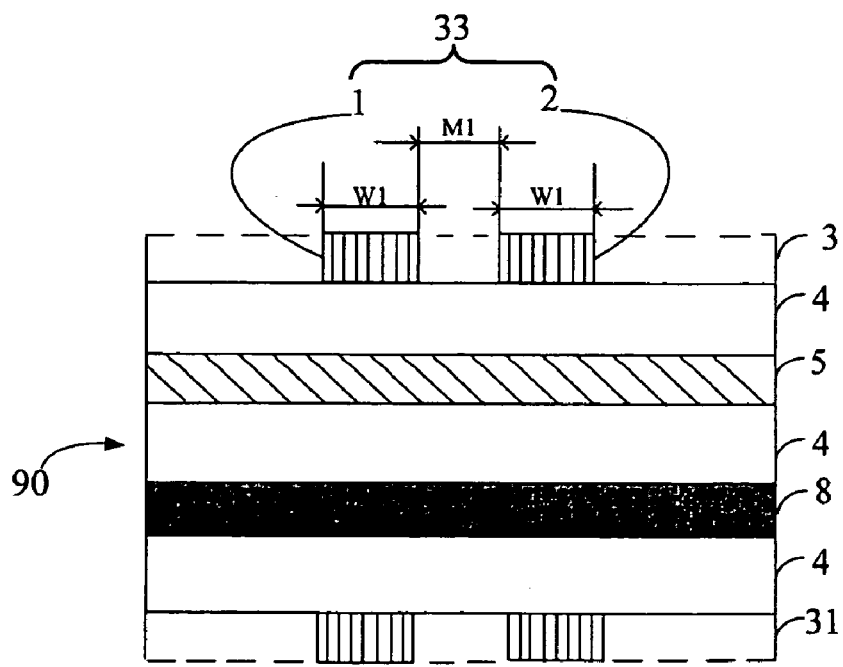
FIG. 2 is a schematic, cross-sectional view taken along a line I-I of related art FIG. 1.
Figure 3:
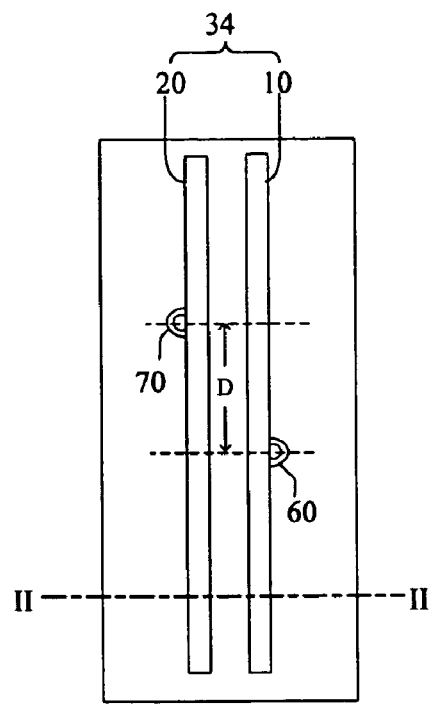
FIG. 3 is a top view of a 4-layer PCB with a differential pair having two mutually dissymmetrical vias of the preferred embodiment of the present invention.
Figure 4:
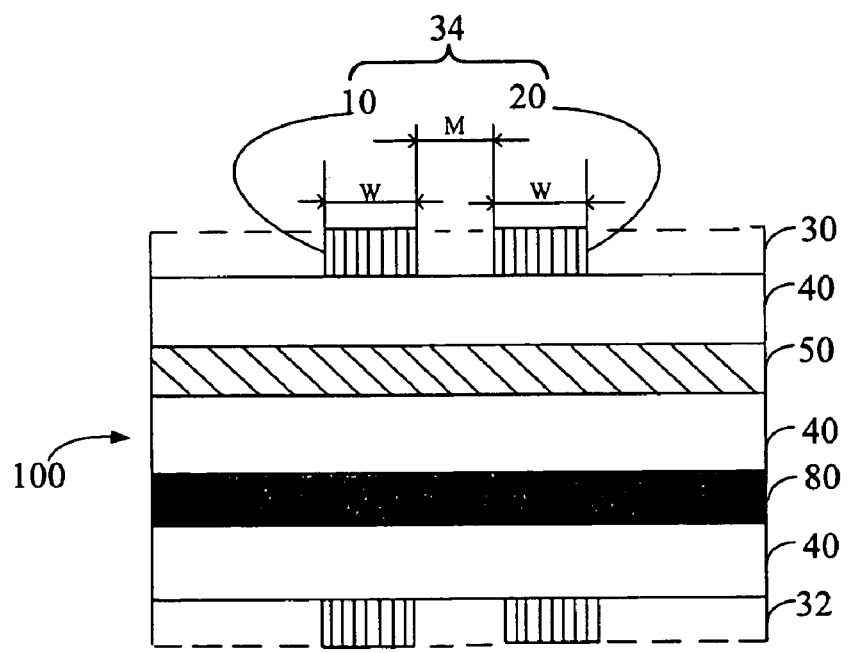
FIG. 4 is a schematic, cross-sectional view taken along a line II-II of FIG. 3.

Referring to FIG. 3 and FIG. 4, a 4-layer PCB 100 (FIG. 4) includes a first signal plane 30, a medium layer 40, a ground plane 50, another medium layer 40, a power plane 80, another medium layer 40, and a second signal plane 32, in that order as shown in FIG. 4. In the first signal plane 30, there is a differential pair 34. The differential pair 34 includes a transmission line 10 and a transmission line 20. The line 10 and the line 20 have a same length, and are parallel. A width M between the line 10 and the line 20 is invariable as shown in FIG. 4. A width of the line 1 or the line 2 is W as shown in FIG. 4. Discontinuous connective points for the differential pair like a through via 60 abutting the line 10 and another through via 70 abutting the line 20 are dissymmetrical about the differential pair 34 as shown in FIG. 3. Radiuses of the via 60 and the via 70 are same. A distance between the vias 60, 70 along the differential pair 34 is a length D as shown FIG. 3.

Figure 5:
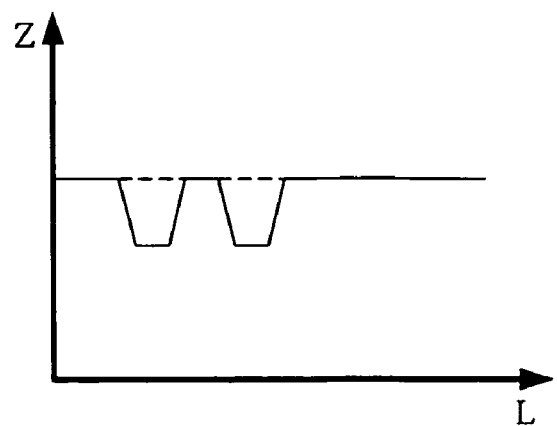
FIG. 5 is a graph showing two curves of an impedance Z of the differential pair of FIG. 3 when a space between the two vias is too great.
Figure 6:
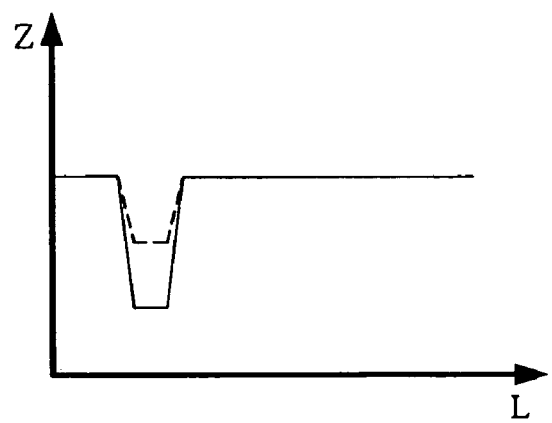
FIG. 6 is a graph showing two curves of the impedance Z of the differential pair of FIG. 3 when a space between the two vias is zero.
Figure 7:
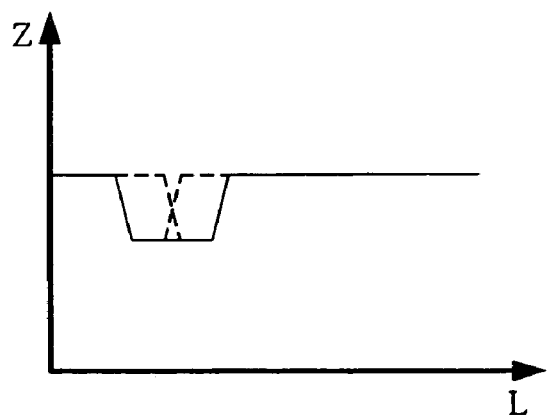
FIG. 7 is a graph showing two curves of the impedance of the differential pair of FIG. 3 when a distance between the two vias is ½ TV (T is a signal rise time, and V is signal speed).

Referring to FIG. 5 to FIG. 7, using simulation software, such as Computer Simulation Technology (CST), to analyze the differential pair 34, some curves are graphed as shown in the FIGS. 5, 6,. 7. In the FIGS. 5, 6 and 7, the signal rise time is same, a y-axis stands for an impedance Z of the differential pair 34, and an x-axis stands for a distance L along the differential pair starting from the signal source end of the differential pair.

As shown in the FIG. 5, when the length D (FIG. 3) is substantial large, concave parts of two curves of impedances of the vias 60 and 70 are separate. Thus there are two points causing reflection, that is to say signals through the differential pair 34 have a strong reflection. As shown in the FIG. 6, when the length D (FIG. 3) is zero, we will get a superposition of the concave parts of the two curves. The superposition makes impedance there much less than either of the impedances of the vias 60, 70. That is to say the signals through the differential pair 34 will have a stronger reflection too. As shown in the FIG. 7, when the length D (FIG. 3) is equal to ½ TV (T is signal rise time, V is speed of the signal), there is partially superposition, so the impedance is not less than either of the impedances of the vias 60, 70. Additionally, there is only one point causing reflection along the differential part 34.

In the illustrated embodiment, we find that when the length D is equal to ½ TV there is only one point causing reflection, and impedance of the point is not less than either of impedances of the vias 60, 70. Thus the invention can reduce reflection, and improve signal integrity.

The present invention is not limited to be employed by the 4-layer PCB, and can be used by another PCB, such as a 6-layer PCB, or an 8-layer PCB. The arrangement of the vias 60, 70 for the differential pair is applicable to all kinds of discontinuous connective points including PCB testing points abutting the lines 10, 20 respectively as well.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A layout configuration of a differential pair for a printed circuit board (PCB) having a signal plane, the layout configuration comprising:
    a differential pair on the signal plane;
    a pair of vias abutting the differential pair, and the pair of vias being mutually dissymmetrical about the differential pair; and
    a distance between the pair of vias along the differential pair being equal to ½ TV, wherein T is a signal rise time, V is a speed of the signal.

2. The layout configuration as claimed in claim 1, wherein the differential pair comprises two signal transmission lines, the two signal transmission lines have a same length and are parallel to each other.

3. The printed circuit board as claimed in claim 2, wherein one of the pair of vias abuts one of the two signal transmission lines, the other one of the pair of vias abuts the other one of the two signal transmission lines.

4. The printed circuit board as claimed in claim 1, wherein radiuses of the pair of vias are equal.

5. A method of improving signal integrity of a differential pair having two vias, the method comprising the steps of:
    providing the differential pair, wherein the differential pair comprising two signal transmission lines; and
    providing the two vias, a distance of the two vias along the two signal transmission lines is equal to ½ TV, wherein T is a signal rise time, V is a speed of the signal.

6. The method as claimed in claim 5, wherein one of the two vias abuts one of the two signal transmission lines, the other one of the two vias abuts the other one of the two signal transmission lines.

7. The method as claimed in claim 5, wherein the two signal transmission lines have the same length, and are mutually parallel to each other.

8. The method as claimed in claim 5, wherein radiuses of the pair of vias are equal.

9. A circuit assembly comprising:
    a signal plane having transmission lines disposed therein for signal transmission;
    said transmission lines comprising a pair of transmission lines functioning as a differential pair arranged in said signal plane and extending along a preset direction parallel to said signal plane; and
    a pair of discontinuous connective points arranged in said signal plane around said pair of transmission lines, a first point of said pair of connective points electrically connectable with a non-end portion of a first line of said pair of transmission lines, and a second point of said pair of connective points electrically connectable with a non-end portion of a second line of said pair of transmission lines, said first point offset from said second point for a preset distance along said preset direction of said pair of transmission lines in order for compensating reflective signals caused by electrical connection of said pair of connective points with said pair of transmission lines when signals travel through said pair of transmission lines, wherein said first point and said second point are respectively located at two opposite lateral sides of said pair of transmission lines.

10. The circuit assembly as claimed in claim 9, wherein said preset distance is equal to ½ TV, while T is a signal rise time of said traveling signals, V is a speed of said signals.

11. The circuit assembly as claimed in claim 9, wherein said first point of said pair of connective points is the same size as said second point.

* * * * *